(12) United States Patent
Loeffelholz et al.

(10) Patent No.: US 7,705,248 B2
(45) Date of Patent: Apr. 27, 2010

(54) EMI SHIELDED MODULE

(75) Inventors: Todd A. Loeffelholz, Minnetonka, MN (US); Zakhary Bluband, Minnetonka, MN (US); Joseph S. Czyscon, Plymouth, MN (US); Terry E. McClellan, Maple Grove, MN (US); Allen Podell, Palo Alto, CA (US); Bruce C. Ogren, Edina, MN (US); David E. Schomaker, Lino Lakes, MN (US); James Kerekes, Waterville, MN (US)

(73) Assignee: ATX Networks Corp., Ajax, Ontario (CA)

( * ) Notice: Subject to any disclaimer, the term of this patent is extended or adjusted under 35 U.S.C. 154(b) by 0 days.

(21) Appl. No.: 10/505,312

(22) PCT Filed: Mar. 7, 2003

(86) PCT No.: PCT/US03/07256

§ 371 (c)(1),
(2), (4) Date: Aug. 10, 2005

(87) PCT Pub. No.: WO03/077264

PCT Pub. Date: Sep. 18, 2003

(65) Prior Publication Data

US 2006/0005981 A1  Jan. 12, 2006

Related U.S. Application Data

(63) Continuation-in-part of application No. 10/094,513, filed on Mar. 7, 2002, now abandoned.

(51) Int. Cl.
*H05K 9/00* (2006.01)

(52) U.S. Cl. .................. 174/382; 174/377; 174/560; 361/752; 361/816

(58) Field of Classification Search ............. 174/50, 174/53, 66, 67, 35 CE, 35 R, 559, 560, 520, 174/377, 382; 220/241, 242; 361/752, 753, 361/816; 439/927
See application file for complete search history.

(56) References Cited

U.S. PATENT DOCUMENTS 3,622,684 A  11/1971  Press
3,917,899 A  11/1975  Oliver (Continued)

FOREIGN PATENT DOCUMENTS

JP  5-77978  10/1993

(Continued)

OTHER PUBLICATIONS

Written Opinion mailed May 21, 2007.

(Continued)

*Primary Examiner*—Hung V Ngo
(74) *Attorney, Agent, or Firm*—Brinks Hofer Gilson & Lione

(57) ABSTRACT

A module for containing a circuit is provided that attenuates emitted signals without the use of a cover. The module includes a housing and a receptacle. The housing has a front having a certain thickness and the receptacle is accessible from the front of the housing. The receptacle is shaped to receive a circuit component and forms a waveguide.

22 Claims, 15 Drawing Sheets

U.S. PATENT DOCUMENTS

| | | | |
|---|---|---|---|
| 4,749,968 | A | 6/1988 | Burroughs |
| 4,873,600 | A | 10/1989 | Vogele |
| 4,928,818 | A | 5/1990 | Friess et al. |
| 5,087,796 | A | 2/1992 | Norman |
| 5,158,470 | A | 10/1992 | Zarreii |
| 5,348,491 | A | 9/1994 | Louwagie et al. |
| 5,387,761 | A | 2/1995 | Simonis |
| 5,592,545 | A | 1/1997 | Ho et al. |
| 5,638,035 | A | 6/1997 | Romerein et al. |
| 5,645,449 | A | 7/1997 | Sabo |
| 5,909,155 | A * | 6/1999 | Anderson et al. ........... 333/100 |
| 5,955,930 | A | 9/1999 | Anderson et al. |
| 5,963,109 | A | 10/1999 | Schiltmans |
| 5,977,866 | A | 11/1999 | Joseph, Jr. et al. |
| 6,045,232 | A * | 4/2000 | Buckmaster ................. 362/20 |
| 6,094,156 | A | 7/2000 | Henty |
| 6,127,630 | A | 10/2000 | McKenzie et al. |
| D440,558 | S * | 4/2001 | Fishman .................... D14/217 |
| 6,242,690 | B1 * | 6/2001 | Glover ....................... 174/387 |
| 6,289,210 | B1 | 9/2001 | Anderson et al. |
| 6,327,155 | B1 * | 12/2001 | Niepmann et al. .......... 361/757 |
| 6,459,517 | B1 * | 10/2002 | Duncan et al. .............. 398/135 |
| 6,486,399 | B1 | 11/2002 | Armstrong et al. |
| 6,545,562 | B2 | 4/2003 | Loeffelholz et al. |
| 2002/0004378 | A1 | 1/2002 | Anderson et al. |

FOREIGN PATENT DOCUMENTS

| | | |
|---|---|---|
| JP | 08-330782 | 12/1996 |
| JP | 09-018167 | 1/1997 |
| JP | 09-102692 | 4/1997 |
| WO | WO 98/25416 | 6/1998 |

OTHER PUBLICATIONS

U.S. Appl. No. 10/094,513, non-final Office Action mailed Mar. 3, 2003, 10 pages.

U.S. Appl. No. 10/094,513, non-final Office Action mailed Sep. 15, 2003, 13 pages.

U.S. Appl. No. 10/094,513, final Office Action mailed Mar. 12, 2004, 12 pages.

U.S. Appl. No. 10/094,513, Advisory Action mailed Jun. 29, 2004, 2 pages.

U.S. Appl. No. 10/094,513, non-final Office Action mailed Sep. 9, 2004, 11 pages.

U.S. Appl. No. 10/094,513, final Office Action mailed Mar. 10, 2005, 12 pages.

U.S. Appl. No. 10/094,513, non-final Office Action mailed Nov. 16, 2005, 11 pages.

U.S. Appl. No. 10/094,513, final Office Action mailed May 5, 2006, 12 pages.

U.S. Appl. No. 10/094,513, non-final Office Action mailed Apr. 5, 2007, 15 pages.

U.S. Appl. No. 10/094,513, Advisory Action Before the Filing of an Appeal Brief mailed Jul. 26, 2006, 3 pages.

European Search Report mailed Sep. 11, 2007.

Nov. 8, 2007 Non-Final Office Action in U.S. Appl. No. 10/094,513, 17 pages.

Sep. 2, 2008 Non Final Office Action in U.S. Appl. No. 10/094,513, 17-pages.

Mar. 4, 2009 Final Office Action in U.S. Appl. No. 10/094,513, 19-pages.

Mar. 26, 2009 Advisory Action in U.S. Appl. No. 10/094,513, 3-pages.

* cited by examiner

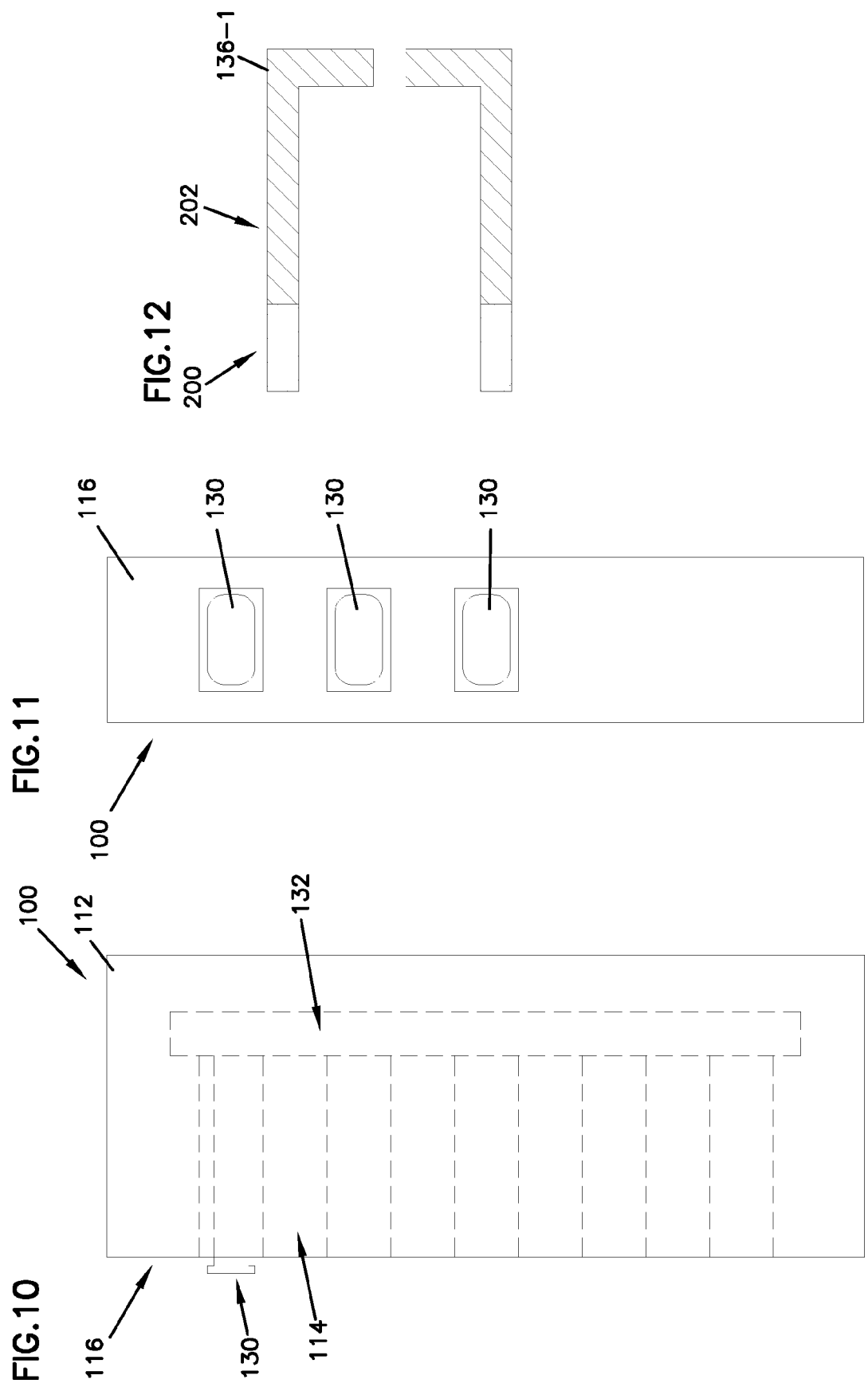

EMI SHIELDED MODULE

This application is a National Stage application of International Application No. PCT/US03/07256, filed Mar. 7, 2003, which is a Continuation-in-Part of application Ser. No. 10/094,513, which application(s) are incorporated herein by reference.

BACKGROUND OF THE INVENTION

In the telecommunications industry and more particularly in the video transmission industry, signals (e.g., 5 MHz to 1 GHz) are carried over coax conductors from a headend to customers. At the headend of the systems, numerous signals are manipulated to achieve a wide variety of functions and objectives. For example, signals carried on numerous coax cables may be combined onto a single coax conductor. Similarly, a signal on a main coax conductor may be divided into a plurality of signals carried on branch coax conductors.

In addition to combining, splitting, diverting or adding signals, the headend will also include a module for modifying signals. For example, in order to adequately tune the system, it may be desirable to provide attenuators or the like to attenuate a signal to a desired level. Further, as a broadband RF signal is carried over a length of cable, the high frequency range of the signal may be attenuated more than a low frequency range of the signal. As a result, equalizers are utilized to modify the signal to have a level intensity throughout its frequency range.

Frequently, tuning is accomplished through the use of plug-in devices (e.g., attenuators or equalizers). Exemplary systems including plug-in devices are disclosed in U.S. Pat. No. 6,289,210 which is hereby incorporated by reference.

Typically, a module such as a combiner has receptacles mounted on a printed circuit board. Terminals of a plug extend into a receptacle and are electrically coupled to the circuit board by electrical components that are all located on the same side of the circuit board. In particular, electrical components communicate with the receptacle and electrically couple terminals of a plug to the proper layer of the circuit board using vias, for example, if necessary. This style of mounting increases the amount of signal radiating around the electrical components causing cross talk in adjacent circuits. Also, because the leads of the electrical components are inductive, special circuit designs are used to compensate.

It is desirable to improve the amount of isolation between adjacent ports on a module. In addition, it is desirable to reduce parasitics that reduce loss of a specific port and increase insertion loss.

It is important to provide electromagnetic shielding to modules that house electrical components. For example, in a combiner module, a plurality of attenuator plugs that house circuitry are inserted in one side of the module. For example, a plurality of attenuator plugs may be inserted in receptacles of the housing. Once the plugs are inserted, a conductive cover is placed over the plug and receptacles to shield the circuit board from the outside environment and vice versa. When the cover is removed for maintenance, for example, the module radiates signals into the outside environment about 60 dB down from the carrier. Such radiation interferes with the operation of the headend. Sometimes, it is possible that the cover is not replaced after the maintenance is completed. Other times the repairs may take hours to perform while the cover must remain off.

It is desirable to provide a module in which such emissions are at least 100 dB down from the carrier so that the possibility of interference is reduced. In addition, it is desirable to provide a module with improved shielding.

SUMMARY OF THE INVENTION

According to a first aspect of the invention, there is provided a module for containing a circuit. The module includes a housing and a receptacle. The housing has a front having a certain thickness and the receptacle is accessible from the front of the housing. The receptacle is shaped to receive a circuit component and forms a waveguide.

According to a second aspect of the invention, there is provided a module for containing a circuit. The module includes a housing and a receptacle. The housing has a wall having a certain thickness and the receptacle is accessible from a surface of the housing. The receptacle is shaped to receive a circuit component and forms a waveguide.

BRIEF DESCRIPTION OF THE DRAWINGS

FIG. 10 is a side view of a module according to another preferred embodiment of the present invention.

FIG. 11 is a front view of the module shown in FIG. 10.

FIG. 12 is a cross-sectional view of a portion of a receptacle according to a preferred embodiment of the present invention;

DETAILED DESCRIPTION OF THE PREFERRED EMBODIMENTS OF THE PRESENT INVENTION

Figure 1:
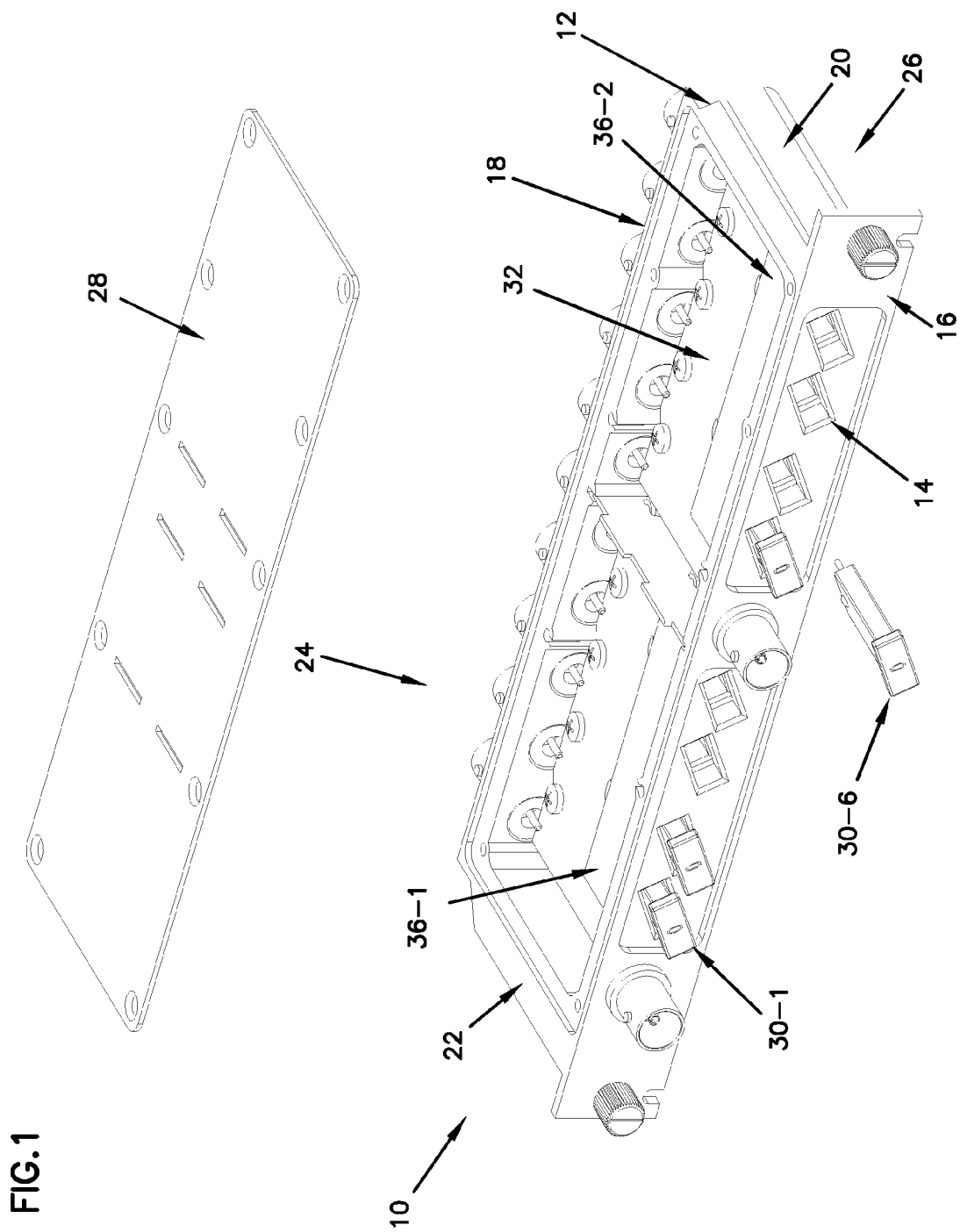
FIG. 1 is a perspective view of an eight port RF combiner module 10 according to a preferred embodiment of the present invention with a top plate removed.

Referring now to the drawing figures in which identical elements are numbered identically throughout, a description of the preferred embodiments of the present invention will now be provided.

It will be appreciated that the disclosed RF components are merely examples of the type of equipment to which the various aspects of the present invention are applicable. Thus, it will also be appreciated that the various aspects of the present invention are applicable to types of RF components other than those specifically shown. Further, the present invention has general applicability in the telecommunications field, and is not limited to RF applications.

FIG. 1 is a perspective view of an eight port RF combiner module 10 according to a preferred embodiment of the present invention with a top plate removed. The module 10 includes a housing 12. The housing 12 includes a front 16 and a back 18 opposite the front 16. The front and back 16, 18 are joined by a pair of sides 20 and 22. While the front and back are illustrated as being parallel to one another, they may be at an angle with respect to one another. In one preferred embodiment, major side 24 of the housing 12 is open and major side 26 is closed by a plate formed as an integral member of the rest of the housing 12 which can not be removed from the housing 12 and major side 24 is enclosed by a removable plate 28 secured to the housing 12 by fasteners (e.g., bolts or screws). Alternatively, major side 26 may be open as well and enclosed by a removable plate like major side 24.

The housing 12 is adapted for at least partially enclosing radio frequency circuitry (e.g., splitter circuitry, combiner circuitry, etc.). While the circuitry could have any number of known configurations, preferably the circuitry is provided on a circuit board 32 sized to be mounted within the housing 12. The module 10 includes a at least one receptacle but preferably a plurality of receptacles 14 for each containing a plug 30 that is accessible from the front of the housing. While accessibility from the front of the module 10 is described as a preferred embodiment, if the plug 30 is to be accessed from the back, the bottom, top or sides of the module, the preferred embodiments of the present invention may be employed respectively in the back, the bottom, top or sides of the module 10 and the present invention is not limited to access only through the front of the module. The receptacle 14 which will be described in detail hereinafter may be formed by a combination of a cutout extending through the front 16 of the housing 12 and plug connectors 36-1, 36-2. Alternatively, the receptacles 14 may be formed by a plug connector having a built-in waveguide as will be described in detail hereinafter. Other combinations can be appreciated in providing a waveguide to shield EMI wherein the removable plug is accessed other than by the front of the module 10.

In one embodiment of the present invention, the front 16 of the housing 12 has a thickness, t, that creates a waveguide that provides a desired amount of attenuation for signal emitted from the housing 12. Preferably, the thickness ranges from about 0.2 inches to about 0.8 inches. More preferably, the thickness is about 0.25 inches and most preferably the thickness is about 0.75 inches. In a preferred embodiment, eight receptacles 14 are located in the housing 12. Each receptacle 14 is sized to receive a plug 30 therein. Each plug has a plastic housing which contains circuitry such as an attenuator circuit, equalizer circuit of other similar circuit. Terminals 29 (see FIG. 5) are exposed in a rear portion of the plug for electrically coupling the plug to circuitry located on the circuit board 32. Mounted at one edge of the circuit board 32 are plug connectors 36-1 and 36-2 as will be described in detail hereinafter with respect to FIG. 6. Four plugs 30 are received in one plug connector 36-1 and the remaining plugs 30 are received in the other plug connector 36-2. It will be appreciated that one plug connector may be provided to receive all of the plugs or that individual plug connectors may be provided for each plug or any combination of the above configurations.

The phrase "plug connector" will be understood to include devices or arrangements adapted for receiving or otherwise providing electrical connections between the terminals of the plugs and the circuit board on which it is mounted. In the preferred embodiments, the plug connectors are adapted for providing electrical connections with multi-pin RF circuitry plugs such as equalizer plugs or attenuator plugs.

Figure 4:
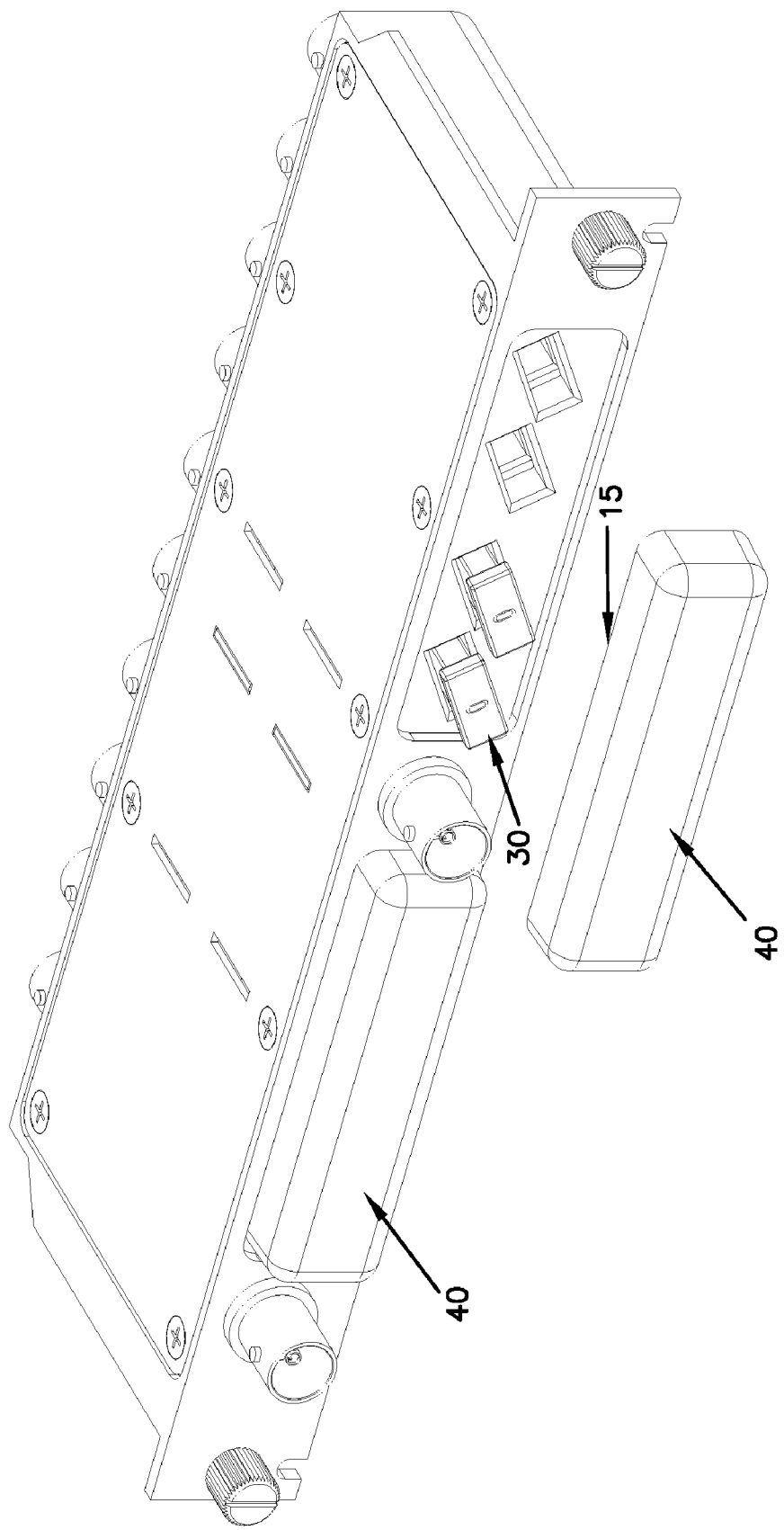
FIG. 4 is a perspective view of the module shown in FIG. 1 with one of the covers affixed to the front wall of the housing and the other cover removed therefrom.

When the circuit board 32 is mounted within the housing 12, the attenuator plugs 30 can be accessed from the front 16 of the housing 12 without the use of tools. The housing 12 may also include covers 40 that are secured to the front 16 of the housing 12 so as to cover the receptacles 14 as can be seen in FIG. 4. The cover 40 may be secured by snapping barbs 15, for example. By removing the cover 40 from the housing 12, the attenuator plugs 30 can be accessed. As will be described in detail herein after, unlike known systems that require conductive covers for EMI shielding, the module 10 according to the preferred embodiments of the present invention does not require such shielding. Covers 40 may be provided for aesthetic purposes or to prevent unauthorized access to the plugs, however, the covers 40 may be formed out of a nonconductive material such as plastic which provides a cost savings.

Figure 3:
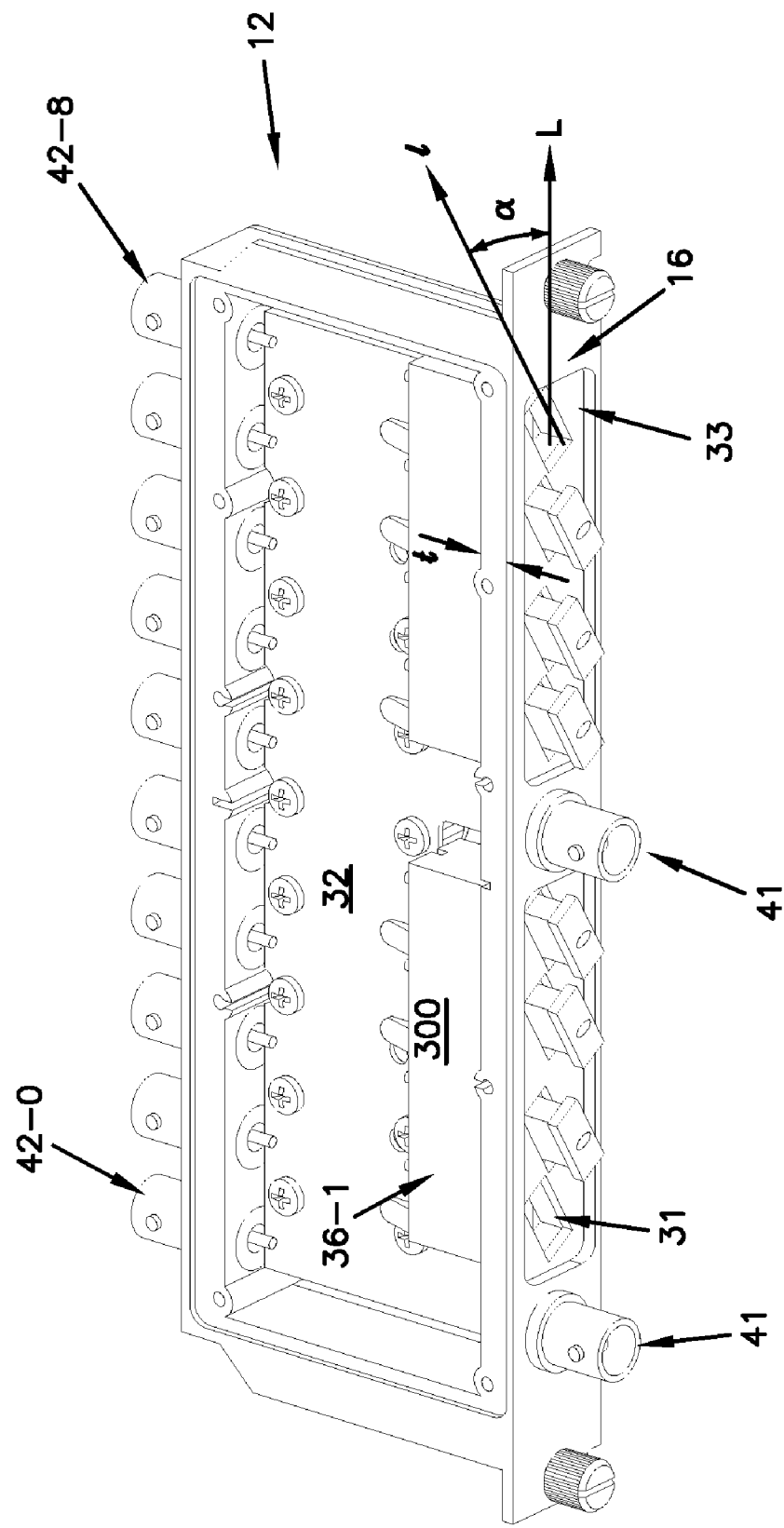
FIG. 3 is a perspective view of the eight port RF module 10 shown in FIG. 1 with the top plate removed.

With reference to FIG. 3, the module 10 further includes a plurality of connectors 42-0 to 42-8 mounted at the back 18 of the housing 12. While the connectors 42-0 to 42-8 can have any number of configurations for receiving a signal, the connectors are preferably 75 ohm coaxial connectors such as BNC type connectors or F type connectors. The connectors 42-0 to 42-8 are preferably connected to a rear edge of the circuit board 32 by conventional techniques such as card edge connectors. Additionally, grounded shields of the connectors 42-0 to 42-8 are preferably in electrical contact with the housing 12. Monitor ports 41 are electrically connected to the circuit board 32, and are adapted to be mounted at the front 16 of the housing 12.

Figure 2:
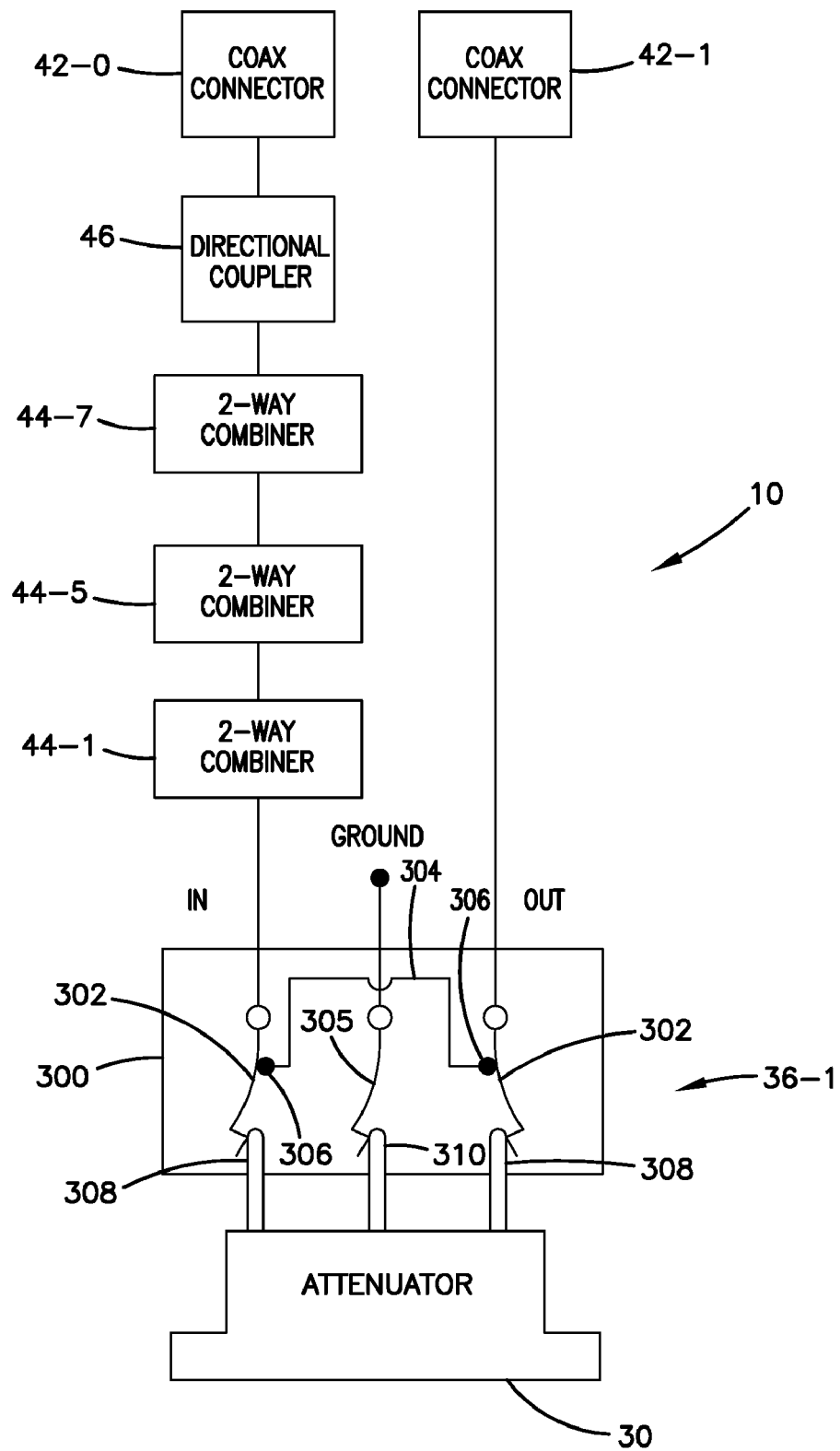
FIG. 2 schematically depicts an exemplary circuit diagram for one plug 30 the combiner of FIG. 1.

FIG. 2 schematically depicts an exemplary circuit diagram for one plug 30 of the combiner of FIG. 1. In a preferred embodiment, the plug 30 houses an attenuator circuit. As shown in FIG. 2, the combiner includes a first two-to-one combiner 44-1 preferably in the form of a transformer electrically connected to plug connector 36-1. The first combiner 44-1 and a second combiner (not shown) are electrically connected to a fifth two-to-one combiner 44-5. The fifth two-to-one combiner 44-5 and a sixth two-to-one combiner (not shown) are electrically connected to a seventh two-to-one combiner 44-7. The seventh two-to-one combiner 44-7 is electrically connected to a directional coupler 46. The directional coupler 46 is electrically connected to coaxial connector 42-0 as well as monitor port 41 as is well known to those of ordinary skill in the art.

While the configuration of FIG. 2 has been described as an eight to one coupler, it will be appreciated that the same configuration could also be used as an eight-to-one splitter with monitor capabilities by slightly modifying the configuration of the directional coupler 46. In other words, it will be understood by those of skill in the art that the transformers 44-1 to 44-7 can be used as splitters as well as combiners.

Referring to FIG. 2, the plug connector 36-1 includes a dielectric housing 300 only a portion of which is illustrated that can be mounted at the edge of the circuit board as will be described in detail with reference to FIG. 6. Two through-contacts 302 (i.e., IN and OUT contacts) are mounted within the housing 300. One of the through-contacts 302 is electrically connected to the combiner 44-1, and the other through-contact 302 is electrically connected to the coaxial connector 42-1. A conductive bypass-path 304 is used to provide an electrical connection between the two through-contacts 302.

The bypass-path 304 includes contact regions 306 positioned adjacent to each of the through-contacts 302. The base member connector 36-1 also includes a ground contact 305 positioned between the two through-contacts 302. The ground contact 305 is electrically connected to ground.

While the through-contacts 302 and the ground contact 305 could have a variety of different configurations, the contacts 302 and 304 are depicted in FIG. 2 as resilient, conductive springs. The through-contacts 302 are preferably biased toward the contact regions 306 of the bypass-pathway 304 such that when no plug is inserted in the housing 300, the through-contacts 302 engage their respective contact regions 306 (i.e., the through-contacts "normally" engage the contact regions). The engagement between the through-contacts 302 and the contact regions 306 causes the bypass-pathway circuit 304 to be closed such that signals can be routed through the plug connector 36-1 even in the absence of a plug. Each plug 30 has three exposed terminals 308, 310 that will be electrically coupled to the circuit board. It will be appreciated that contacts 302, 305, and terminals 308 and 310 may not all be located in the same plane.

As can be seen in FIG. 3, the front 16 of the housing 12 has a longitudinal axis L that extends from one of the pair of sides 20 to the other sidewall 22. The receptacles 14 in the front 16 of the housing 12 also each have a longitudinal axis 1. As can be seen in FIG. 3, for example, the longitudinal axis 1 of each receptacle 14 is an angle $\alpha$ with respect to the longitudinal axis L of the front 16. In a preferred embodiment, the angle may range from about ±10 degrees to about ±80 degrees. In a preferred embodiment, the angle is about ±45 degrees. Because of this angle, the IN and OUT terminals of each plug 30 will straddle the circuit board 32. So the IN terminal will make contact with a first side of the circuit board and the OUT terminal will make contact with a second, opposite side of the circuit board as will be described with respect to FIG. 8. Thus, unlike a mounting which was previously described where all terminals are located on one side of the circuit board, by angling the receptacles, there is no need for using vias, for example, to bring a terminal into electrical contact with the proper layer of the circuit board. Because the IN and OUT terminals are located on opposite sides of the circuit board, isolation between ports is improved. In addition, parasitics and insertion loss are reduced and return loss of a specific port is increased.

Also, by placing the receptacles 14 at an angle, the density of plugs 30 can be increased because less space is used.

The front 16 of the housing 12 has a thickness (t) preferably ranging from about 0.2 inches to about 0.8 inches. The receptacles extend through the front 16 and create a waveguide 31 that helps reduce the signals emitted from the module. In addition, because the front 16 is thicker than known systems, the circuit board 32 located in the interior of the housing 12 is pushed further away from the front 16 of the housing 12. Due to the combination of the spacing and the thick, waveguide-shaped receptacles 14, the module 10 does not need any additional EMI shielding over the receptacles 14 and yet the module still radiates signals that are reduced to better than 100 dB down from the carrier. In addition, because the plugs 30 are longer in length in order to reach the plug connectors, the circuitry located inside the plastic housing of the plug is located near the exposed terminals of the plug. When the plug 30 is inserted in the plug connector, the circuitry in the plug is now located inside the module 10 instead of exterior thereto. This also provides improved performance.

The region 33 surrounding the receptacles may be recessed as shown to allow a cover to be placed over the receptacles 14. While not necessary for shielding purposes, such a cover may be desirable for aesthetic reasons. In addition, a cover may be desirable to prevent access to the plugs. Because the cover is not needed for purposes of shielding, it may be made out of a nonconductive material thereby resulting in cost savings from known systems.

FIG. 4 is a perspective view of the module shown in FIG. 1 with one of the covers 40 affixed to the front 16 of the housing 12 and the other cover 40 removed. The covers 40 may be provided with snapping barbs 15 to fasten the covers 40 to the front 16 of the housing 12. To remove a cover 40 from the front 16, opposite sides of the cover may be squeezed to disengage the snapping barbs from the recessed area in the front 16.

Figure 5:
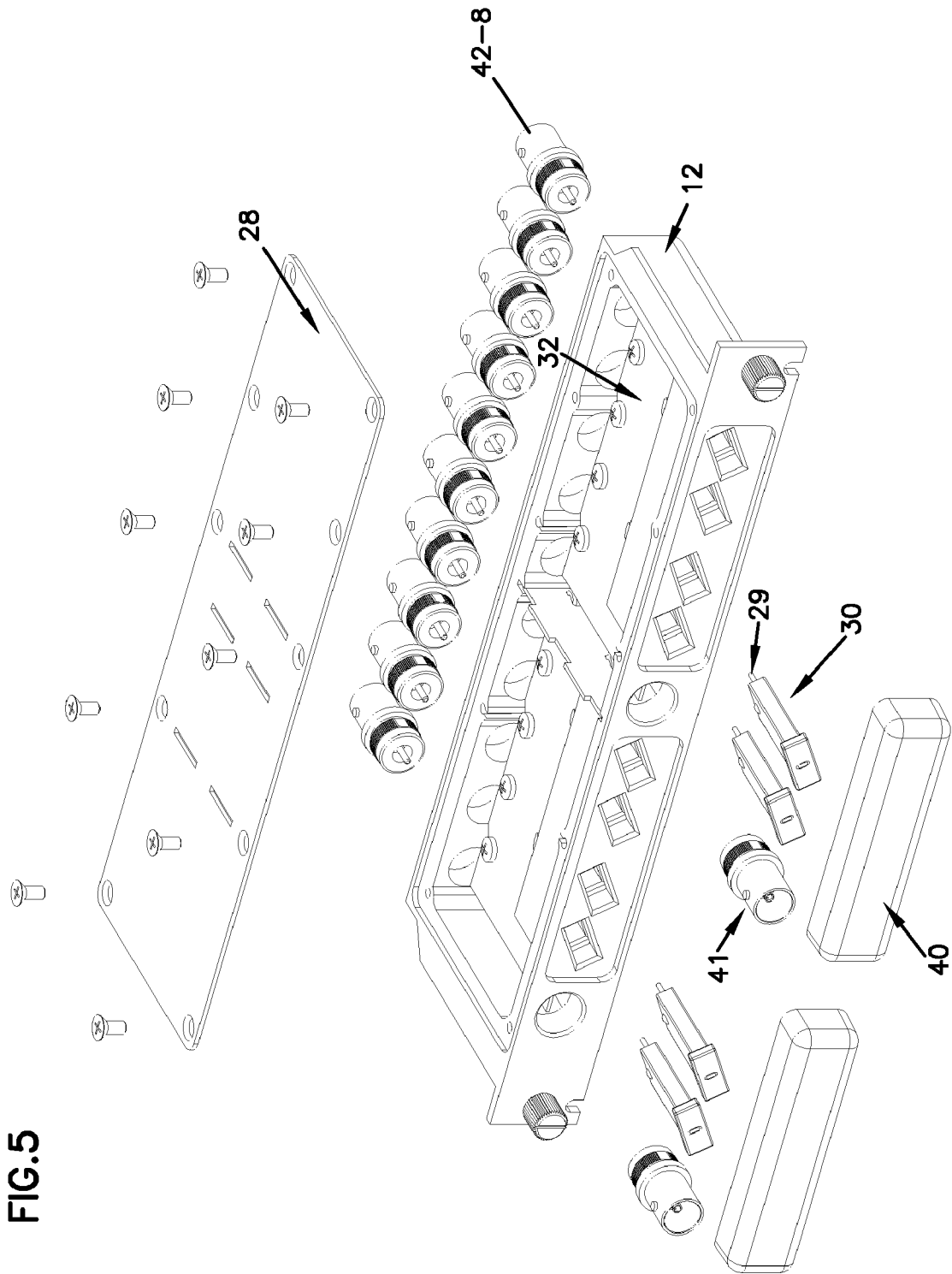
FIG. 5 is an exploded view of the module shown in FIG. 1.

FIG. 5 is an exploded view of the module shown in FIG. 1. It can be appreciated in FIG. 5 that a majority of the circuit board is pushed back away from the front 16.

Figure 6:
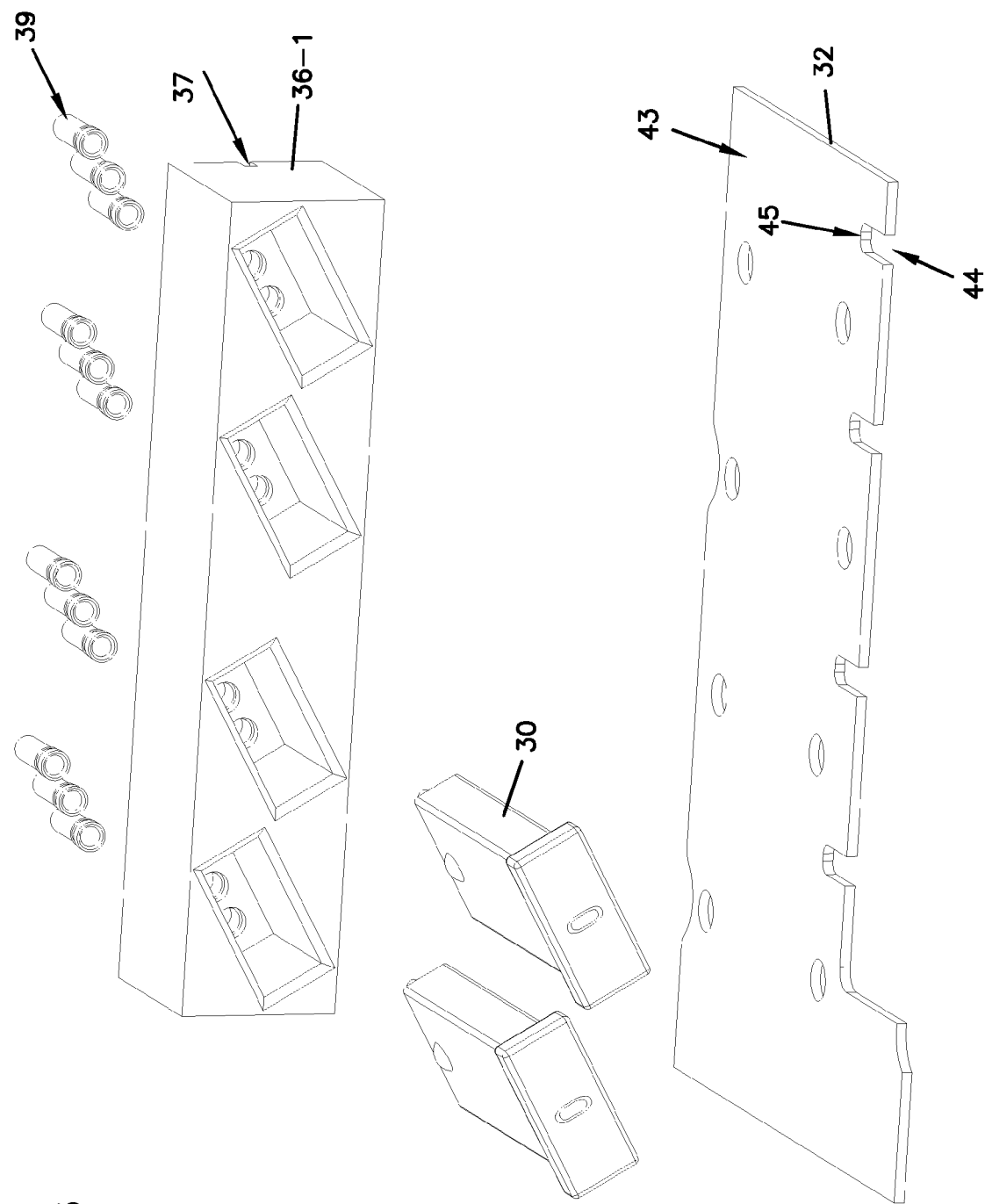
FIG. 6 is an exploded view of a portion of the circuit board, plug connector and plugs according to a preferred embodiment of the present invention.

FIG. 6 is an exploded view of a portion of the circuit board, plug connector and plugs according to a preferred embodiment of the present invention. The plug connector 36-1 has a groove 37 extending along a back wall of the plug connector 36-1. A front edge of the circuit board 32 fits into the groove. Each plug 30 has three exposed terminals in a rear portion of the plug. Partially located in the plug connector 36-1 are three sockets 39, one for each of the plugs terminals. The sockets 39 are only partially inserted in the plug connector, the remaining portion is exposed so that it may make electrical contact with appropriate layers on the circuit board 32 as will be described in detail hereinafter. The circuit board 32 has a plurality of layers. On a first side 43 the board will have conductive traces and circuitry such as transformers (none of which are illustrated). Likewise, a second side opposite the first side 43 also will have conductive traces and circuitry. Located along the front edge of the circuit board are a plurality of recesses 44. Recesses 44 expose a conductive trace 45 located in the center of the board. This conductive trace 45 is held at ground. When the sockets 39, plug connectors 36-1,2 and circuit board 32 are assembled, the middle socket is located in a recess 44 and the exposed portion of the socket is soldered to trace 45. The other two terminals adjacent the middle one extend through their respective sockets and one terminal will lie on a top surface of the circuit board and the other terminal will lie on a bottom surface of the circuit board.

Figure 8:
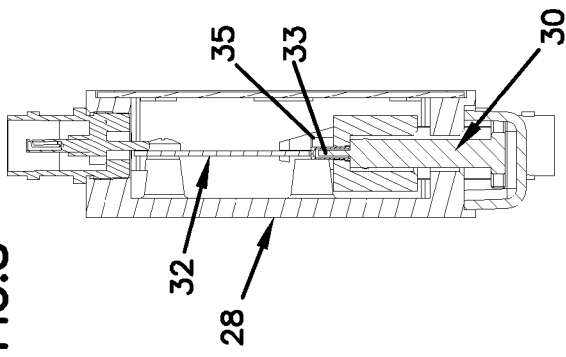
FIG. 8 is a cross-sectional view of the module shown in FIG. 7 taken along lines 8-8.
Figure 7:
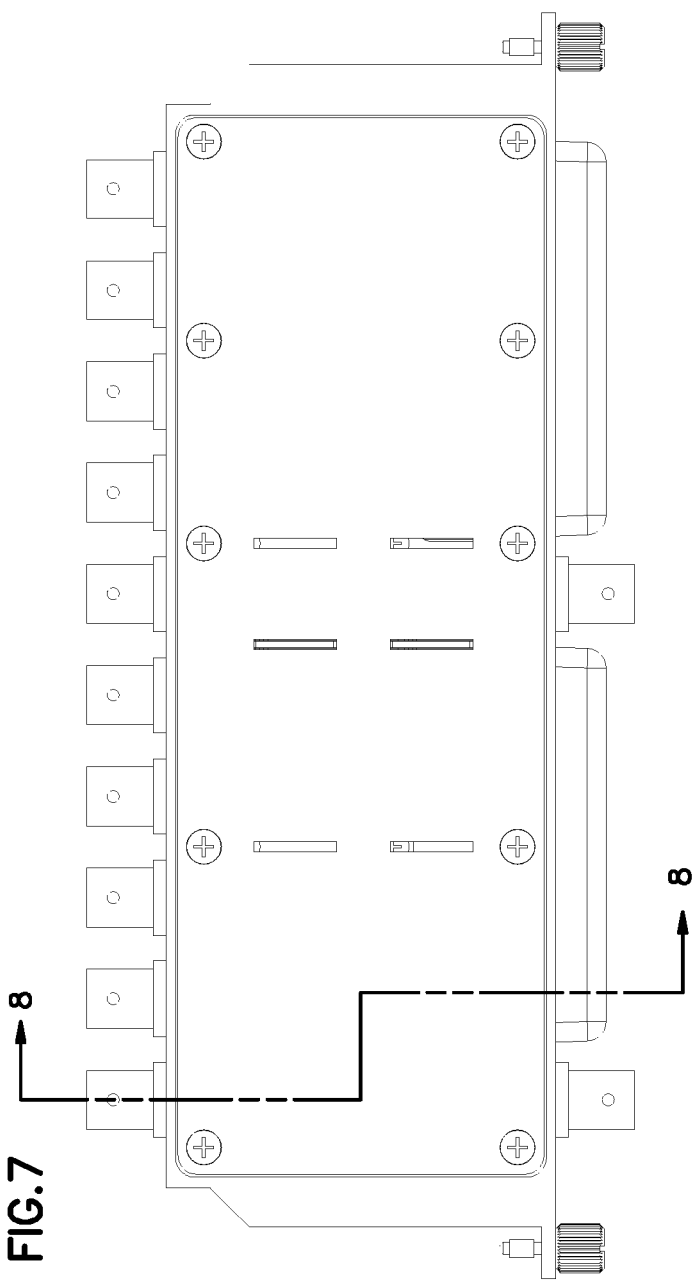
FIG. 7 is a top view of the module shown in FIG. 1.
Figure 9:
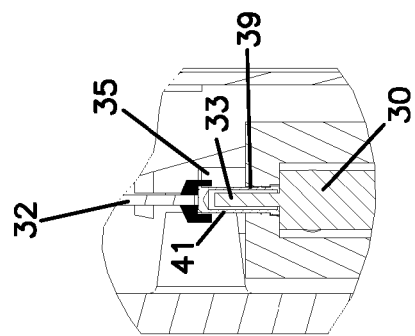
FIG. 9 is an enlarged view of a portion of the cross-section shown in FIG. 8.

FIG. 7 is a top view of the module shown in FIG. 1. FIG. 8 is a cross-sectional view of the module shown in FIG. 7 taken along lines 8-8. In the cross section, all of the parts are assembled. FIG. 9 is an enlarged view of a portion of the cross-section shown in FIG. 8 showing the arrangement of the plug connector 36-1, plug 30 and circuit board 32. The middle terminal 33 slides inside the middle socket which is electrically coupled to the ground trace located in the center of the circuit board. One of the other two terminals 35 is shown contacting the bottom surface of the circuit board and the other terminal is not shown but contacts the top surface of the circuit board.

FIG. 10 is a side view of a module 100 according to another preferred embodiment of the present invention. Some internal structures of the module 100 are shown in dashed lines. Not all of the internal structures of the module 100 have been illustrated. In addition, no external structure such as mounting flanges or connectors has been illustrated for purposes of clarity. In this preferred embodiment, a housing 112 preferably made of conductive material houses a circuit board 132. In this preferred embodiment, the circuit board has been rotated 90 degrees from the preferred embodiments already discussed. Located in the front 116 of the housing 112 are a plurality of receptacles 114 sized to receive plugs 130. The receptacles 114 are formed in the housing which is made of conductive material and thus the receptacles form waveguides that attenuate emissions. FIG. 11 is a front view of the module 100 shown in FIG. 10.

FIG. 12 is a cross-sectional view of a portion of a receptacle according to a preferred embodiment of the present invention. Instead of making the front of the housing thicker to create the waveguide, the plug connector itself may be provided with its own individual waveguide. As seen in FIG. 12, the plug connector forms a receptacle to receive a plug and has a front portion 200 and a rear portion 202. The front portion 200 is made of conductive material whereas the rear portion 202 is made of nonconductive material. The front portion 200 of the plug connector thus forms the waveguide.

FIGS. 13-18 illustrate a RF module 300 according to another preferred embodiment of the present invention. The module 300 is depicted as an 8-to-1 splitter/combiner. However, it will be appreciated that the various inventive aspects of the embodiment of FIGS. 13-18 are applicable to any number of different types of module configurations such as 4-to-1 splitters/combiners, 6-to-1 splitters/combiners, other types of splitters/combiners, equalizers, directional couplers, and filters. The various aspects are also applicable to active components such as protection switches and amplifiers.

Figure 13:
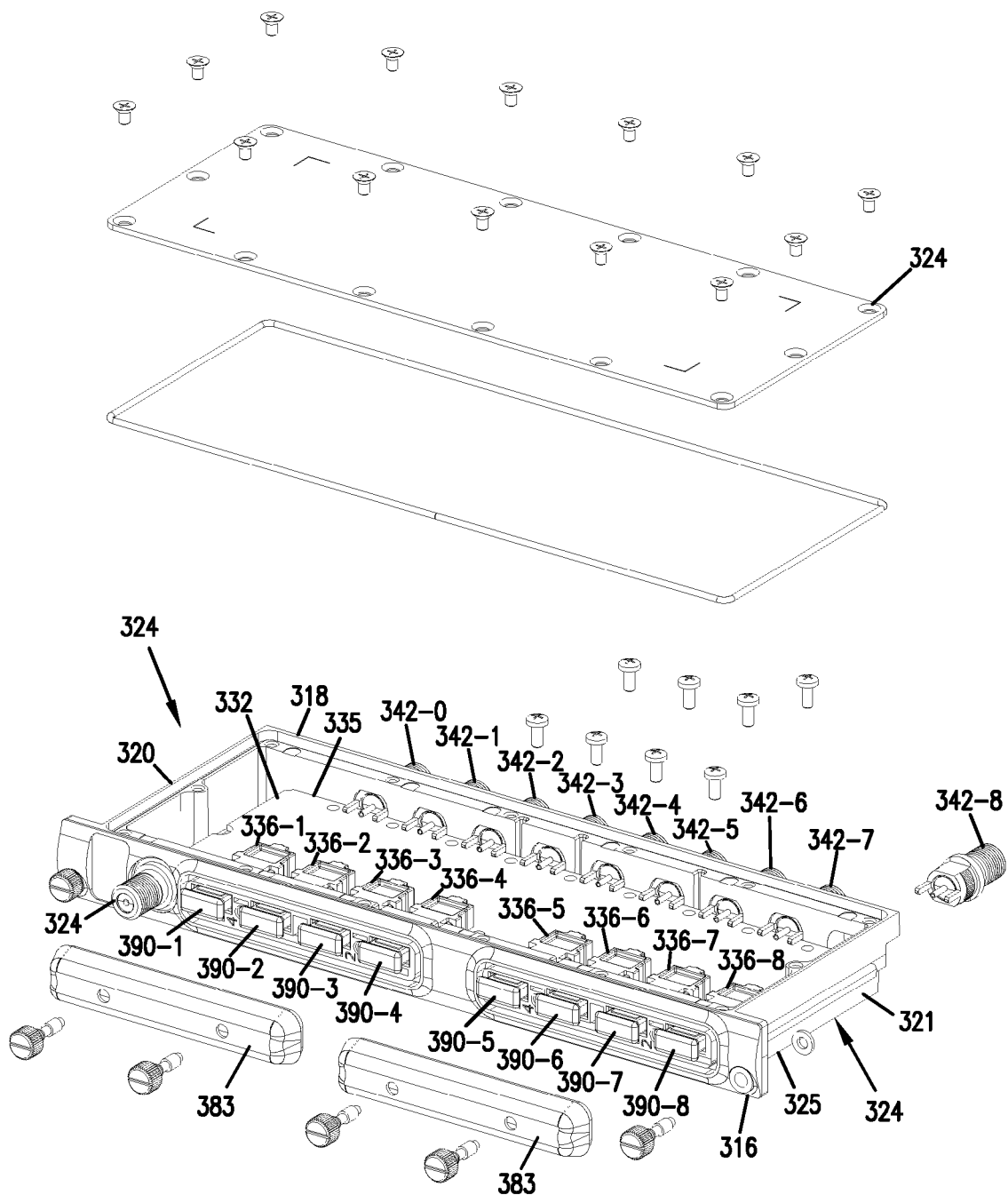
FIG. 13 is a front, perspective, exploded view of an alternative module.
Figure 14:
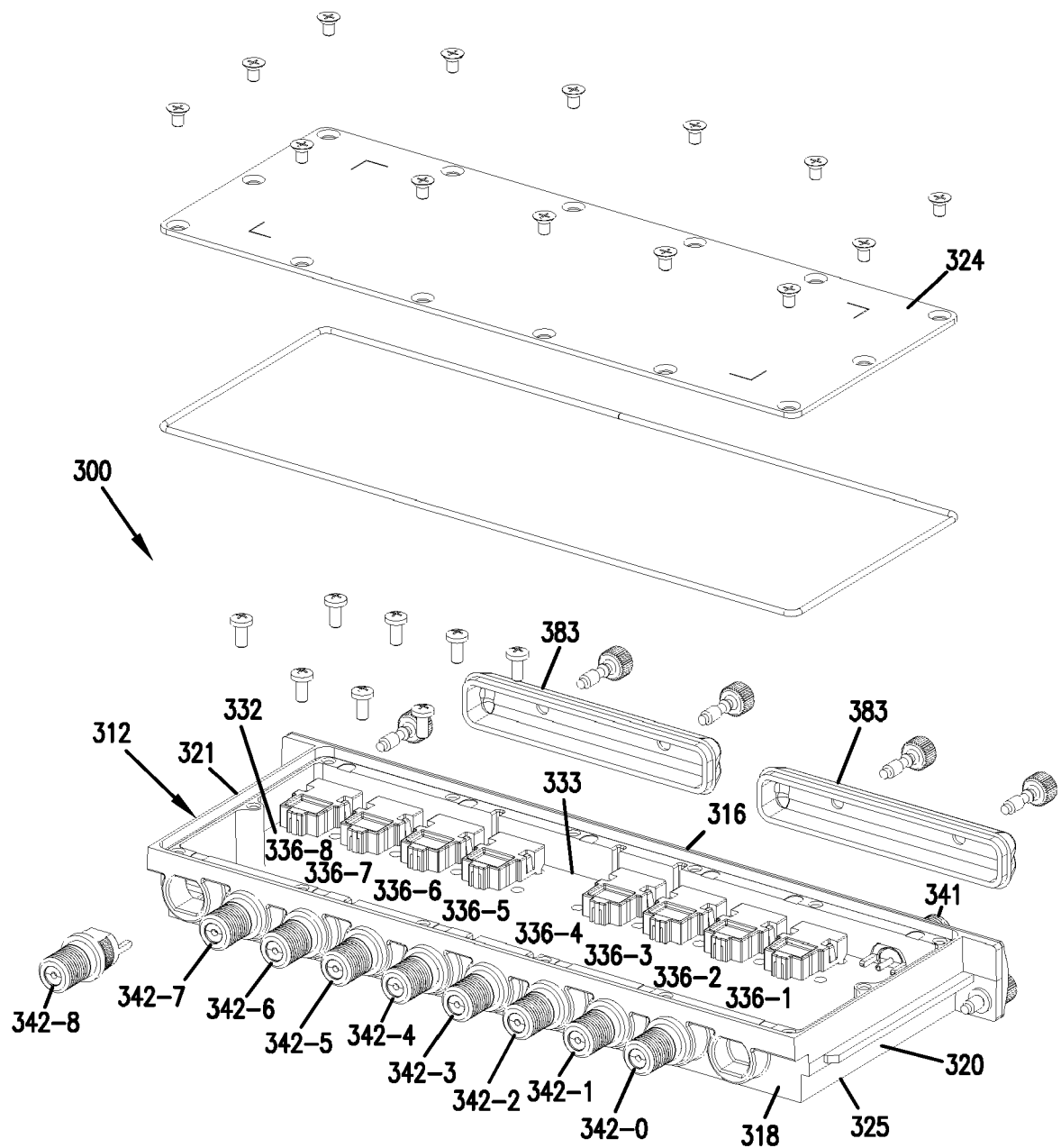
FIG. 14 is a rear, perspective, exploded view of the module of FIG. 13.

Referring to FIGS. 13 and 14, the module 300 includes a housing 312 preferably made of an electrically conductive material suitable for shielding electromagnetic interference (EMI) so as to limit the degree to which RF signals are emitted from the housing 312. The housing 312 has a generally rectangular configuration and includes a front wall 316 positioned opposite from a rear wall 318. The housing 312 also includes two oppositely positioned minor side walls 320, 321 and two oppositely positioned major side walls 324, 325 that extend between the front and rear walls 316, 318. The major side wall 324 is shown as a plate that can be removed to provide access to the interior of the housing 312.

The housing 312 is preferably made of an electrically conductive material capable of shielding EMI. Example materials include metals such as aluminum and zinc. In certain embodiments, the housing can be manufactured by a die casting process. In other embodiments, the housing, or portions of the housing can be manufactured from plastic plated with a metal material such as nickel.

The housing 312 encloses a circuit board 332 having a front edge 333 and a rear edge 335. A plurality of rear connectors 342-0 to 342-8 (e.g., co-axial connectors) are electrically connected to the rear edge 335, while a plurality of pad connectors 336-1 to 336-8 as well as a monitor connector 341 are electrically connected to the front edge 333. The circuit board 332 includes conventional splitter/combiner circuitry for electrically connecting the pad connectors 342-0 to 342-8 to the pad connectors 336-1 to 336-8. Example splitter/combiner circuitry is described in U.S. application Ser. No. 09/780,585, filed on Feb. 9, 2001 and entitled Plug Connector for Cable Television Network and Method of Use, which is hereby incorporated by reference in its entirety.

Figure 17:
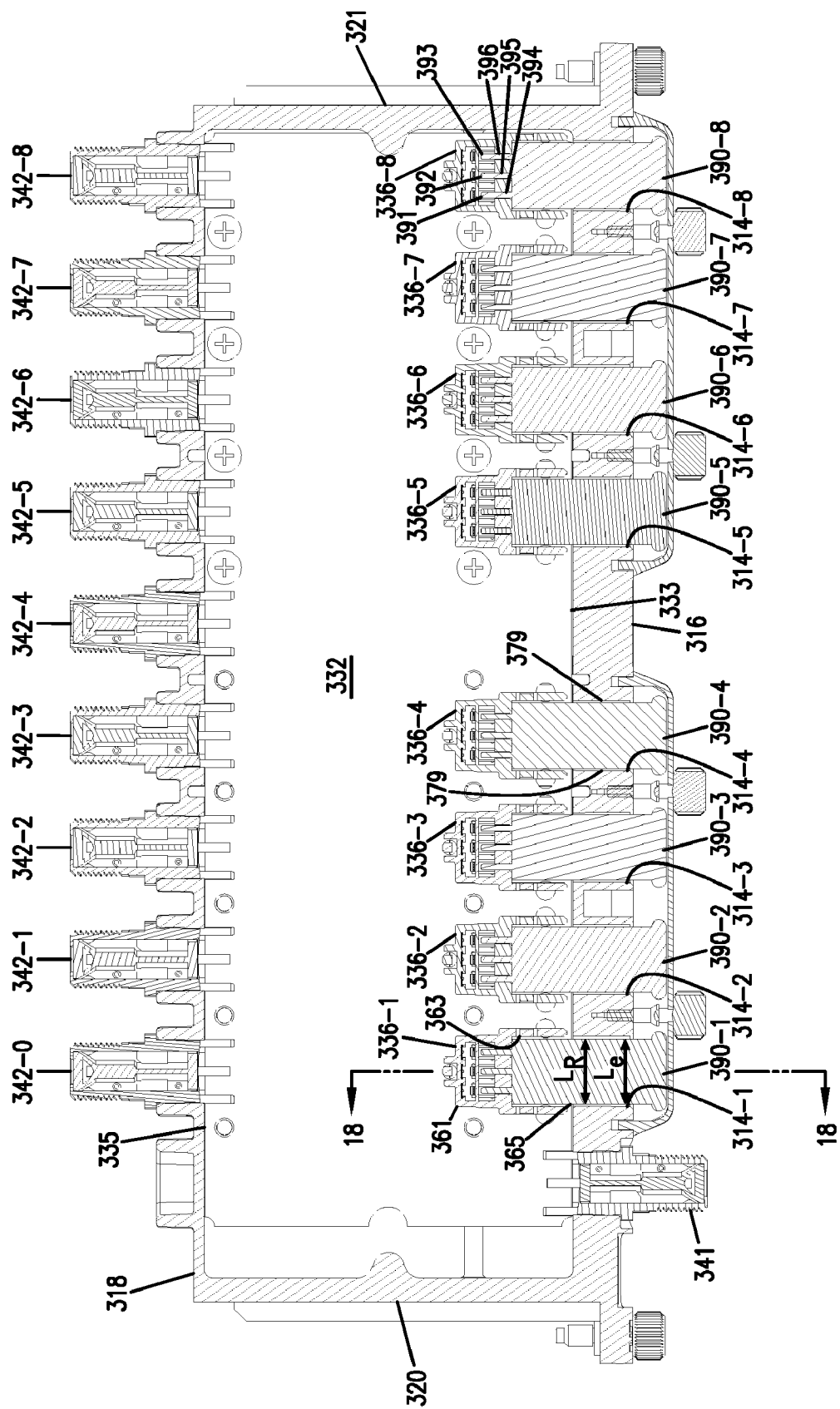
FIG. 17 is a cross-sectional view of the module of FIGS. 13 and 14.
Figure 18:
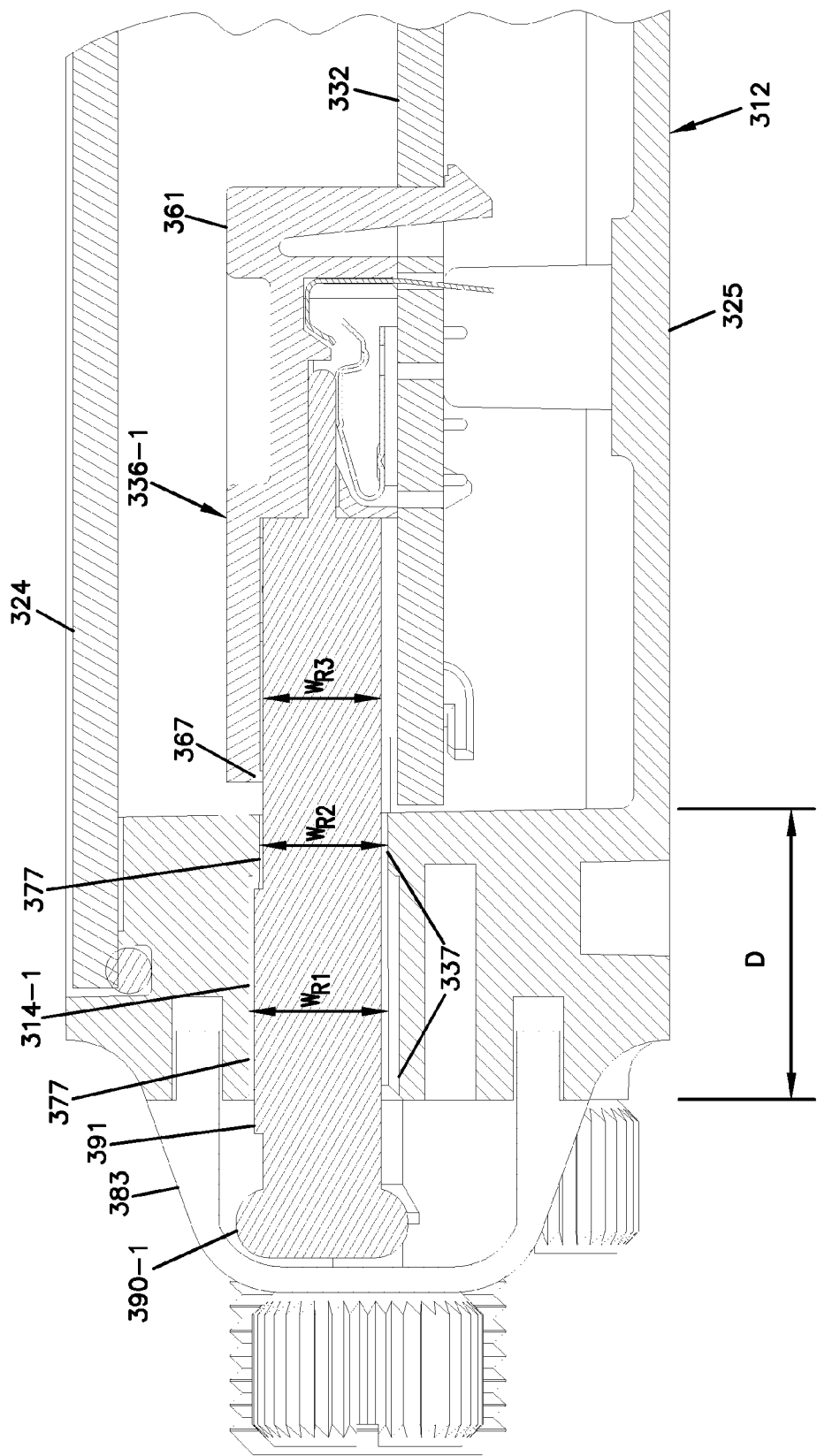
FIG. 18 is a cross-sectional view taken along section line 18-18 of FIG. 17.

The pad connectors 336-1 to 336-8 are adapted for receiving pads such as attenuator pads 390-1 to 390-8. The pad connectors 336-1 to 336-8 include dielectric housings 361 mounted to the circuit board 332. As shown in FIGS. 17 and 18, the housings 361 define pad receiving compartments 363 adapted for receiving dielectric bodies 365 of the pads 390-1 to 390-8. The housings 361 can include chamfers 367 for facilitation insertion of the pad bodies 365 into the compartments 363. Each of the attenuator pads 390-1 to 390-8 can include three pins 391-393 adapted to be received within corresponding sockets 394-396 of the pad connectors 336-1 to 336-8. When the pins 391-393 are received within the sockets 394-396, the pins electrically connect with corresponding circuitry within the pad connectors 336-1 to 336-8 so as to be electrically connected to the circuit board 332. It will be appreciated that the pad connectors 336-1 to 336-8 can include make-before-break circuitry including spring contacts 302, 305 and 306, as previously described with respect to FIG. 2.

Referring to FIG. 17, the rear connectors 342-0 to 342-8 are mounted to the rear wall 318 of the housing 312, and the pad connectors 336-1 to 336-8 are positioned adjacent to an interior side of the front wall 316 of the housing 312. As best shown in FIG. 17, the front wall 316 of the housing 312 defines separate receptacles 314-1 to 314-8 corresponding to each of the pad connectors 336-1 to 336-8. The receptacles 314-1 to 314-8 extend completely through the front wall 316 and can also be referred to openings, holes, passages or channels. The receptacles 314-1 to 314-8 preferably align with the pad receiving compartments 363 of the pad connectors 336-1 to 336-8.

Figure 15:
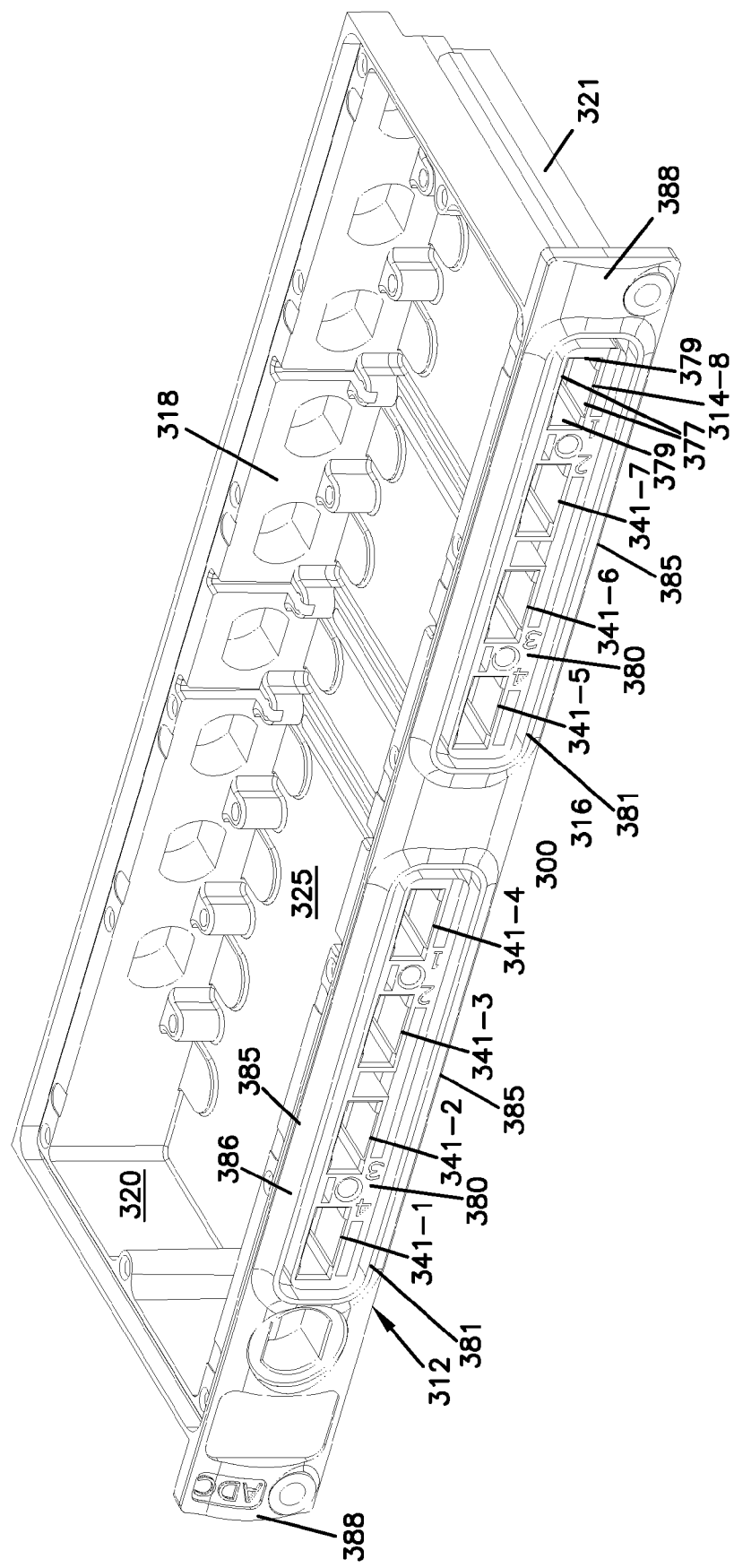
FIG. 15 is a perspective view of the housing of the module of FIGS. 13 and 14 with the cover removed.
Figure 16:
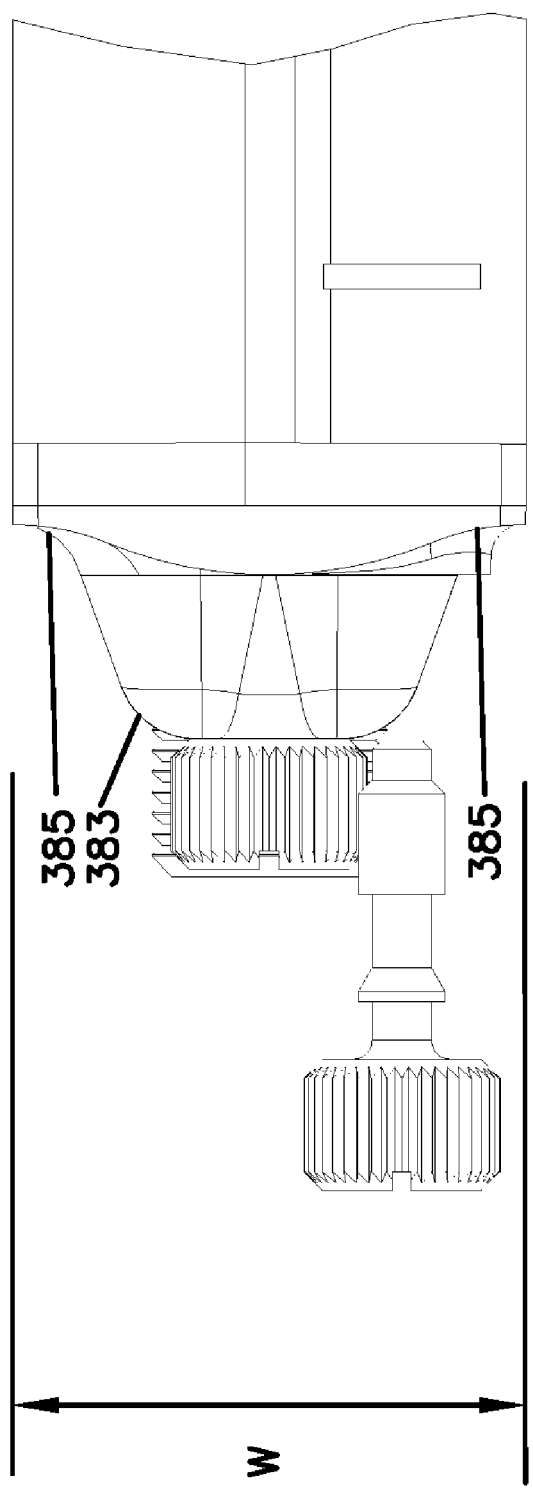
FIG. 16 is a partial end view of the module of FIGS. 13 and 14.

Looking now to FIG. 15, the receptacles 314-1 to 314-8 are defined through two raised, generally planar platforms 380 located at the front face of the front wall 316. A slot 381 is defined generally about the perimeter of each of the platforms 380. The slots are sized and shaped to receive edges of removable covers 383. Contoured regions 386 provide a gradual transition between the raised platforms 380 and recessed side regions 385 of the front wall 316 such that the platforms 380 are thicker than the side regions 385. The front wall 316 also has convex portions 388 (see FIGS. 15 and 16) that extend across a width w of the front face of the front wall 316. The contoured configuration of the front wall 316 causes the front wall 316 to have a greater thickness at a mid-region of the width w as compared to the side regions of the width w.

As shown in FIG. 13, the receptacles 314-1 to 314-8 are sized and shaped for receiving pads the attenuator pads 390-1 to 390-8, and for guiding the attenuator pads 390-1 to 390-8 into the pad receiving compartments 363 of the pad connectors 336-1 to 336-8. Moreover, the front wall 316 is preferably configured to function as an RF choke for limiting the amount of emissions that exit the housing 312 through the front receptacles 314-1 to 314-8. To provide a waveguide/choke function, the receptacles 314-1 to 314-8 are preferably defined by receptacle walls having a depth D (shown in FIG. 18) that is sufficient to prevent emissions from exiting the housing 312 through the receptacles 314-1 to 314-8. In one embodiment, the depth D of the receptacle walls is preferably greater than 0.15 inch. In other embodiments, the depth D is at least 0.175 inches, or at least 0.2 inches, or at least 0.25 inches or at least 0.3 inches, or at least 0.35 inches. In one embodiment, the depth D is about 0.38 inches.

Referring to FIG. 18, the bodies 365 of the attenuator pads 290-1 to 290-8 can include graphics 391 formed thereon that increase the thickness of the attenuator pad bodies 365. To accommodate this thickness variation, the receptacles 314-1 to 314-8 can include enlarged widths WRI for accommodating the graphics 388, and narrower widths $W_{R2}$ positioned adjacent to the pad connectors 336-1 to 336-8.

Referring to FIG. 15, the receptacles 314-1 to 314-8 each have a generally rectangular configuration and are defined by two opposing primary receptacle surfaces 377 and two opposing secondary receptacle surfaces 379. The major and minor surfaces 377, 379 of the receptacle walls function as guide surfaces for channeling the attenuator pads 290-1 to 290-8 into the pad connectors 336-1 to 336-8 during insertion of the attenuator pads 290-1 to 290-8. The receptacles 314-1 to 314-8 are preferably sized such that misalignment of the attenuator pads 290-1 to 290-8 relative to their corresponding connectors 336-1 to 336-8 is not possible during the insertion process. The entrances to the receptacles 314-1 to 314-8 can also be chamfered to further facilitate insertion of the pads.

Preferably, the receptacles 314-1 to 314-8 are sized relative to the outer bodies 365 of the attenuator pads 390-1 to 390-8 such that when the attenuator pads are inserted in their corresponding receptacles 314, the pins of the attenuator pads are directed into their corresponding sockets without requiring manual alignment by the user.

In one embodiment, a length $L_R$ (shown in FIG. 17) of each receptacle is no greater than 0.04 inches larger than a length $L_P$ (shown in FIG. 17) of the corresponding attenuator pad, and the width $W_{R2}$ (shown in FIG. 18) of each receptacle is no greater than 0.02 inches greater than the corresponding width $W_P$ of the attenuator. In alternative embodiments, the lengths $L_R$ of the receptacles are each no greater than 0.03 inches longer than the corresponding lengths $L_P$ of the attenuator pads, and the widths $W_{R2}$ of each receptacle are no greater than 0.015 inches larger than the corresponding widths $W_P$ of the attenuator pads. However, it will be appreciated that these tolerances are merely exemplary, and any opening having contact surfaces capable of engaging the body of an attenuator pad to guide the attenuator pad into a corresponding attenuator pad connector are within the scope of the present invention.

Similar to previous embodiments, the front wall 316 is preferably configured to choke RF emissions to a level such that the module radiates signals that are reduced 100 db down or better from the carrier across an entire frequency range of 5 megahertz to 1 gigahertz, even in the absence of the covers 383. The front wall also chokes radiation originating outside the module in a comparable manner so as the reduce the level of exterior radiation that enters the module.

Figure 19:
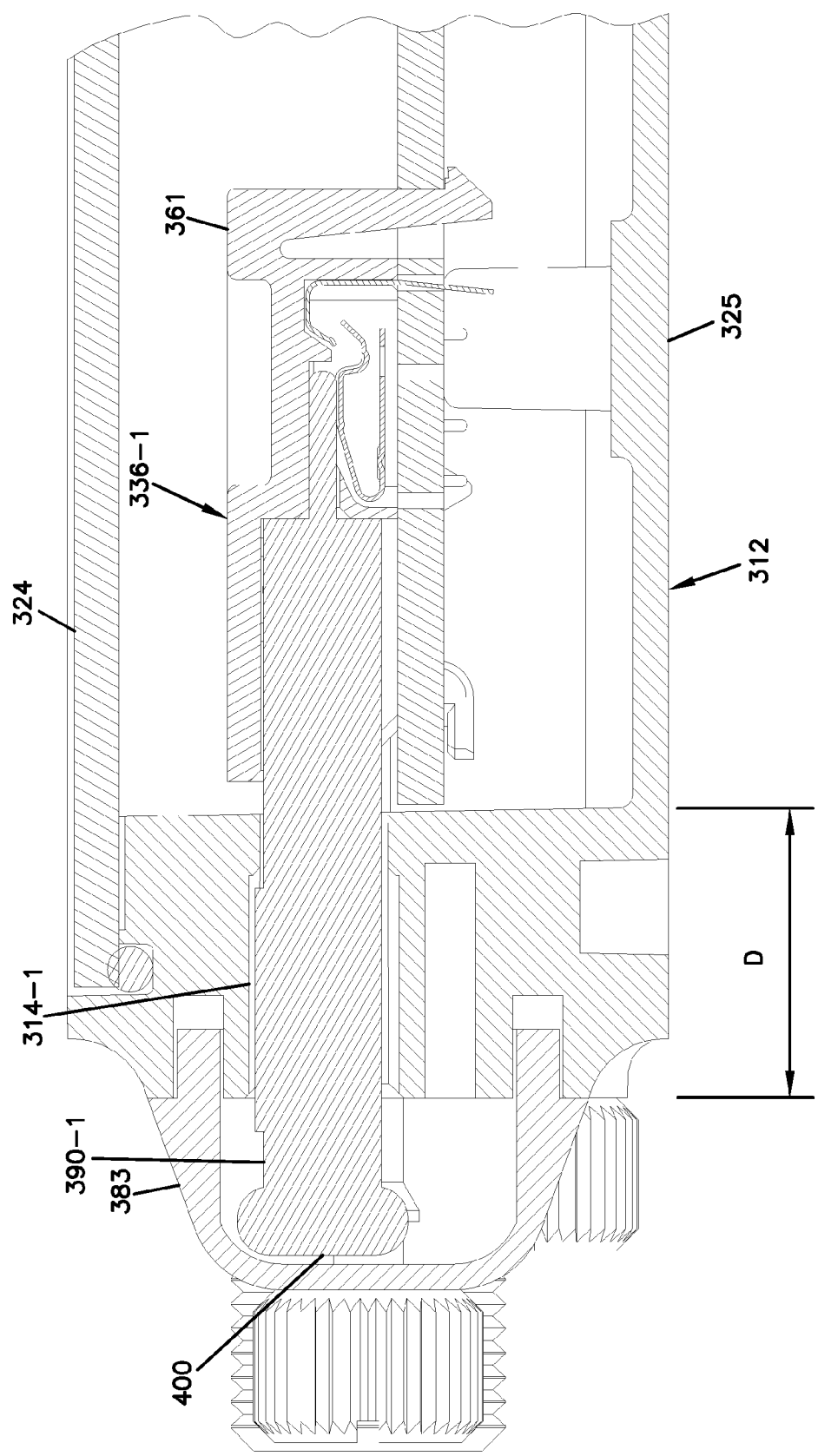
FIG. 19 shows a module with a non-metallic cover.

It will be appreciated that the depth D selected is dependent upon the frequency of the radiation and the preferred attenuation. Thus, the depth D can be varied with different applications, and the broad aspects of the present invention are not limited by the specific dimensions disclosed herein. Further, the selected depth D and desired attenuation are also dependent upon the size of the receptacles. In the depicted embodiment, the receptacles have widths $W_{R2}$ less than about 0.2 inches, and lengths $L_R$ less than about 0.5 inches Because the front end plate is configured as a wave guide or RF choke, it is not necessary to provide conductive covers over the attenuators pads for shielding EMI. However, it may still be desirable to use covers to prevent dust or other contaminants from entering the module, to prevent the attenuator pads from inadvertently being bumped, and to prevent the attenuators from vibrating loose from the pad connectors. Therefore, in alternative embodiments, the module 300 can be equipped with non-metallic or non-electrically conductive covers 383' as shown in FIG. 19. In certain embodiments, the covers 383' can be made of a polymeric material such plastic. Of course, covers made of a material capable of providing additional EMI shielding (e.g., metal covers, plastic covers plated with metal or plastic covers filled with metal) can also be used.

Attenuator pads typically have outer end surfaces 400 (see FIG. 19) on which pad attenuation value markings are provided (e.g., printed or otherwise displayed). In this regard, another inventive aspect of the present disclosure relates to modules having removable covers that allow a technician to read the pad attenuation values of the attenuation pads without requiring the covers to be removed from the modules. For example, the plastic covers 383' can include an optically transparent material (e.g., clear plastic) such that a technician can readily read the pad values through the covers 383'. Alternatively, the covers 383' can include portions that are optically transparent so as to define windows positioned over the pad markings to allow technicians to view the pad markings. In still further embodiments, covers can be provided with openings corresponding to the pad markings on the attenuator pads for allowing a technician to view the pad markings without removing the covers.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A module for containing a circuit, the module comprising:
    a housing having a front wall and a rear wall, the front wall including a conductive material;
    rear connectors mounted at the rear wall; and
    at least one receptacle defined through the front wall for receiving a circuit component, the receptacle being generally rectangular and including a length, a width and a depth, the length being less than or equal to 0.5 inches, the width being less than or equal to 0.2 inches, and the depth being of sufficient magnitude to allow the receptacle to function as an RF choke for choking RF emissions generated within the housing, the depth being at least 0.3 inches;
    wherein the receptacle is defined through a raised platform located at an outer face of the front wall; and
    wherein the outer face is contoured such that the front wall has a greater thickness adjacent a mid-region of a width of the front wall as compared to side regions of the width.

2. A telecommunications module comprising:
    a housing having a wall;
    a receptacle that extends through the wall of the housing;
    radio frequency circuitry positioned within the housing;
    a plug that is received within the receptacle, the plug being electrically connected to the radio frequency circuitry when the plug is inserted within the receptacle;
    the receptacle being configured as a RF choke that chokes RF emissions generated within the housing to a level such that the module radiates signals that are 100 db down or better from a carrier across a frequency range of 5 megahertz to 1 gigahertz even in the absence of a cover over the receptacle.

3. The telecommunications module of claim 2, wherein the receptacle has a minimum depth that is greater than 0.15 inches.

4. The telecommunications module of claim 2, wherein the plug includes an attenuator pad.

5. The telecommunications module of claim 2, further comprising a plurality of receptacles for receiving plugs that electrically connect with the radio frequency circuitry when the plugs are inserted in the receptacles, the receptacles being configured as RF chokes that choke RF emissions generated within the housing to a level such that the module radiates signals that are 100 db down or better from a carrier across a frequency range of 5 megahertz to 1 gigahertz even in the absence of a cover over the receptacles.

6. The telecommunications module of claim 5, wherein each receptacle has a minimum depth that is greater than 0.15 inches.

7. The telecommunications module of claim 5, wherein the plugs include attenuator plugs, wherein the receptacles are generally rectangular and have widths that are less than about 0.2 inches, lengths that are less than about 0.5 inches, and minimum depths that are at least 0.3 inches, wherein the wall comprises a front wall, wherein the housing includes a rear wall positioned opposite the front wall, wherein co-axial connectors are mounted at the rear wall, wherein plug connectors are positioned within the housing adjacent the front wall for electrically connecting the plugs to the radio frequency circuitry when the plugs are inserted into the receptacles, wherein the radio frequency circuitry includes a circuit board that electrically connects the co-axial connectors to the plug connectors, and wherein the receptacles include opposing major surfaces and opposing minor surfaces that function as guide surfaces for channeling the plugs into the plug connectors when the plugs are inserted into the receptacles, the major and minor surfaces being configured such that misalignment of the plugs relative to the plug connectors is not possible during the insertion process.

8. The telecommunications module of claim 2, wherein the radio frequency circuitry is selected from a group including splitter circuitry, combiner circuitry, equalizing circuitry, directional coupling circuitry, and filtration circuitry.

9. The telecommunication module of claim 2, wherein the plug includes plug circuitry, and wherein the plug circuitry is not located exterior to the housing when the plug is inserted in the receptacle.

10. The telecommunications module of claim 2, further comprising a cover for covering the receptacle.

11. The telecommunications module of claim 10, wherein the cover is a plastic cover.

12. The telecommunications module of claim 10, wherein the plug includes an attenuator pad, and wherein the cover is configured such that attenuation values of the attenuator pads can be determined without removing the cover from the housing.

13. The telecommunications module of claim 12, wherein the cover has a transparent plastic construction.

14. The telecommunications module of claim 2, wherein the housing is constructed of an electrically conductive material, and wherein the receptacle is defined by the wall of the housing.

15. The telecommunications module of claim 2, wherein the radio frequency circuitry includes a plug connector for electrically connecting the plug to the radio frequency circuitry, the plug connector including an extension that defines at least a portion of the receptacle, the extension being constructed of an electrically conductive material.

16. The telecommunications module of claim 2, wherein the depth of the receptacle is at least 0.3 inches.

17. The telecommunications module of claim 2, wherein the radio frequency circuitry includes a plug connector for electrically connecting the plug to the radio frequency circuitry when the plug is inserted into the receptacle, wherein the receptacle has a generally rectangular configuration including opposing major surfaces and opposing minor surfaces that function as guide surfaces for channeling the plug into the plug connector when the plug is inserted into the receptacle, the major and minor surfaces being configured such that misalignment of the plug relative to the plug connector is not possible during the insertion process.

18. The telecommunications module of claim 2, wherein the radio frequency circuitry includes a plug connector for electrically connecting the plug to the radio frequency circuitry when the plug is inserted into the receptacle, wherein the receptacle includes a first thickness positioned adjacent to the plug connector and a second thickness positioned outwardly from the plug connector, the second thickness being larger than the first thickness to allow the receptacle to accommodate graphics provided on the plug.

19. The telecommunications module of claim 2, wherein the wall comprises a front wall, wherein the housing includes a rear wall positioned opposite the front wall, wherein co-axial connectors are mounted at the rear wall, wherein a plug connector is positioned within the housing adjacent the front wall for electrically connecting the plug to the radio frequency circuitry when the plug is inserted into the receptacle, and wherein the radio frequency circuitry includes a circuit board that electrically connects the co-axial connectors to the plug connector.

20. The telecommunications module of claim 2, wherein the wall includes an outer face, and wherein the receptacle is defined through a raised platform located at the outer face.

21. The telecommunications module of claim 20, further comprising a cover for covering the receptacle, wherein the housing defines a slot that extends about a perimeter of the raised platform, and wherein the slot is sized to receive an edge of the cover.

22. The telecommunications module of claim 20, wherein the wall has a width, and wherein the outer face is contoured such that the wall has a greater thickness adjacent a mid-region of the width as compared to side regions of the width.

* * * * *